United States Patent [19]

Kikawa et al.

[11] Patent Number: 5,070,272
[45] Date of Patent: Dec. 3, 1991

[54] PHOTOCONDUCTIVE DEVICE AND METHOD OF OPERATING SAME

[75] Inventors: Takeshi Kikawa, Kokubunji; Kazutaka Tsuji; Kenji Sameshima, both of Hachioji; Tadaaki Hirai, Koganei; Junichi Yamazaki; Misao Kubota, both of Kawasaki; Keiichi Shidara, Tama, all of Japan

[73] Assignees: Hitachi, Ltd.; Nippon Hoso Kyokai, Tokyo, Japan

[21] Appl. No.: 547,226

[22] Filed: Jul. 3, 1990

[30] Foreign Application Priority Data

Jul. 5, 1989 [JP] Japan .................. 1-171808

[51] Int. Cl.⁵ .............................................. H01J 29/45
[52] U.S. Cl. ..................................... 313/386; 313/388; 313/384; 313/44
[58] Field of Search .................. 313/13, 46, 44, 384, 313/386, 365, 39, 42, 388; 315/116, 117

[56] References Cited

U.S. PATENT DOCUMENTS

| | | | |
|---|---|---|---|
| 3,185,891 | 5/1965 | Redington et al. | 313/388 |
| 4,484,100 | 11/1984 | Sato | 313/46 |
| 4,888,521 | 12/1989 | Tanioku et al. | 313/366 |

FOREIGN PATENT DOCUMENTS

| | | |
|---|---|---|
| 0255246 | 2/1988 | European Pat. Off. |
| 63304551 | 3/1975 | Japan . |
| 55-14554 | 4/1980 | Japan . |
| 59-26154 | 6/1984 | Japan . |
| 4924619 | 7/1988 | Japan . |
| 63-174245 | 12/1988 | Japan . |

Primary Examiner—Donald J. Yusko
Assistant Examiner—Nimeshkumar D. Patel
Attorney, Agent, or Firm—Antonelli, Terry, Stout & Kraus

[57] ABSTRACT

A photoconductive device having a transparent substrate, a transparent conductive film, a photoconductive film and a layer of an insulator provided on at least part of the substrate and of high thermal conductivity, and a method of operating the photoconductive device. Thus, especially, the temperature of a photoconductive film of an imaging device typical of an image pick-up tube or the photoconductive device which may be a one- or a two-dimensional image sensor or a photocell can be controlled precisely and efficiently.

17 Claims, 6 Drawing Sheets

PHOTOCONDUCTIVE DEVICE AND METHOD OF OPERATING SAME

BACKGROUND OF THE INVENTION

The present invention relates to photoconductive devices and methods of operating same and more particularly to such devices and methods used in imaging devices, photocells, etc., represented by image pick-up tubes, one-dimensional image sensors, two-dimensional image sensors and so on.

Conventionally, photosensors, one-dimensional image sensors, two-dimensional image sensors, image pick-up devices, etc., are generally known as photoconductive devices comprising at least a transparent conductive film and a photoconductive layer superimposed in order on a transparent substrate, as disclosed, for example, in Japanese Patent Publications JP-B-55-14554 and JP-B-59-26154 and Japanese Patent Publications JP-A-49-24619 and JP-A-63-304551.

Generally, the electrical characteristics of a photoconductive film depend on ambient temperature, so that the characteristics of the photoconductive device change depending on the temperature of the photoconductive layer in use. Especially, in a photoconductive device which uses an amorphous semiconductor which mainly includes selenium as a photoconductive film, a dark current and an after image increase as the temperature increases. Long time use of the photoconductive device at high temperature crystallizes the photoconductive film partially to deteriorate the image quality and thus reduce its service life. Conversely, if the temperature used is too low, the sensitivity is likely to decrease, the lag is likely to increase, etc. Thus, the photoconductive device is preferably used under conditions where its performance is best, which is obtained by controlling the temperature of the photoconductive film. For this reason, a method of operating a photoconductive device calls for cooling a target of the image pick-up tube with a thermoelectric cooling device in order to use the photoconductive device in its best state.

SUMMARY OF THE INVENTION

Applicants particularly studied the dark currents and lags of photoconductive devices with a thermoelectric cooling device manufactured by the above conventional techniques. As a result, it has been found that the characteristics have not sufficiently been improved because the thermal conductivity of the transparent substrate is insufficient and hence precise control of the photoconductive device temperature cannot be provided.

It is an object of the present invention to provide a photoconductive device which is capable of controlling the temperature of the photoconductive film precisely and efficiently.

It is another object of the present invention to provide a method of operating the photoconductive device at a temperature where the characteristics of the photoconductive device is best.

The former object is achieved by a photoconductive device comprising a transparent substrate, a transparent conductive film and a photoconductive film successively superimposed on the transparent substrate, and a thermally conductive layer of a material of high thermal conductivity provided on at least a part of the transparent substrate.

The latter object is achieved by controlling the temperature of either the thermally conductive layer or a material of high thermal conductivity and in contact with the thermally conductive layer.

The operation of the present invention will be described taking an image pick-up tube as an example. FIG. 1 is a schematic cross-sectional view of an illustrative image pick-up tube to which the present invention is applied.

Reference numeral 11 denotes a transparent substrate of high thermal conductivity; 12, a transparent conductive film; 13, a photoconductive film; 14, a landing layer of electron beam; 15, an indium ring; 16, a metal target ring; and 17, an image pick-up tube having a built-in electron gun.

While in FIG. 1 the substrate 11 is shown as being all made of a thermal conductive material, it is not necessarily required to be so. As shown in FIGS. 2A-2C, it may have a layered structure where a layer 22 having a uniform thickness and a high thermal conductivity on a part of the substrate.

FIG. 2A is a cross-sectional view of a double layer substrate comprising a glass made mainly of silicon oxide, or quartz plate 21 and a layer 22 of high thermal conductivity disposed thereon. FIG. 2B is a crossetional view of a double layered substrate comprising a layer of high thermal conductivity and a glass or quartz layer 23 disposed thereon. FIG. 2C is a cross-sectional view of a triple layered substrate comprising a double layered substrate and a glass or quartz layer 23 disposed thereon. Any of the layered substrates includes a photoelectric conversion unit comprising a transparent conductive film, a photoconductive film and a landing layer for an electron beam on the upper surface of each of the substrates of FIGS. 2A-2C and receives incident light coming from below.

In the double layered substrate shown in FIG. 2A, the plate 21 acts as a heat insulating layer against external temperature when there is a difference between the external temperature and the controlled temperature of the photoconductive film. Thus, the substrate of FIG. 2A provides efficient temperature control compared to the image pick-up tube having a single layered substrate 11 of FIG. 1. With the double layered substrate of FIG. 2B, a transparent conductive film or the like can be formed uniformly on the layered substrate by smoothing the surface of the layer 23 when it is difficult to sufficiently smooth the surface of the layer 22 of the material of high thermal conductivity. In addition, if the adhesiveness of the transparent conductive film or the photoconductive film to the layer 22 is not satisfactory, the layer 23 acts effectively as an adhesive layer between the transparent conductive layer or the photoconductive layer and the layer 22. The triple layered substrate of FIG. 2C has both the advantages of the double layered substrates of FIGS. 2A and 2B.

The layered substrates each may include a glass plate 21 or layer 23, for example mainly made of silicon oxide and a layer 22 made of a material of high thermal conductivity. In the layered substrates, the layer 22 is bonded to the surface of the plate 21 or layer 23 with an adhesive. It may be formed as a lamination by any of vacuum evaporation, sputtering, chemical vapor deposition (CVD). Alternatively, a glass made mainly of silicon oxide or quartz layer 23 may be formed on a layer 22 made of a material of high thermal conductivity by any one of vapor evaporation, sputtering and CVD.

The thickness of the substrate 11 and layer 22 of high thermal conductivity may be selected in accordance with material and purpose. Usable materials of high thermal conductivity are sapphire, silicon carbide, silicon nitride, cubic boron nitride, diamond, silicon carbide and diamond-like carbon, each of the former five materials is of single crystal and the latter two is amorphous. Especially, single crystal diamond, cubic boron nitride and amorphous diamond-like carbon are of high thermal conductivity and produce similar effects, for example, with 1/100-1/500 of the thickness of single crystal sapphire.

FIG. 3A is a conceptual view of a photoconductive device which comprises the image pick-up tube of FIG. 1, a heater and/or cooler 32, a thermometer 34 (for example, of a thermocouple), a temperature control circuit 33, latter two being parts of a second temperature control system for control of the temperature of the substrate 11, which may be a layered substrate. The control of the temperature of the substrate 11 may be provided, for example, using the heater and/or cooler 32 (for example, of a Peltier device) directly contacting the outer periphery of the target ring 16 disposed on a surface of the indium ring 15 provided in contact with the substrate 11. When there occurs a difference between a set temperature of the temperature control system and the temperature of the substrate 11 sensed by the thermometer 34, the temperature of the substrate is controlled by the temperature control circuit 33 through the heater and/or cooler 32, the target ring 16 and the indium ring 15. By control of the temperature of the subtrate 11, the temperature of the photoconductive film 13 provided on the substrate 11 is controlled effectively. According to the present invention, the distribution of temperature in the surface of the photoconductive film 13 was decreased. Like this, by employing a substrate of high thermal conductivity, the follow-up of the temperature is improved and the probability of overheating/overcooling is reduced. Since the temperature distribution on the surface of the photoconductive film is reduced, the probabilities of deterioration of local portions and characteristics of the photoconductive film are suppressed. The sensitivity of the photoconductive device is increased by decreasing the temperature of the photoconductive film to a low value where thermal noise is negligible. While the thermometer 34 is attached on the atmospheric side of the substrate 11 in FIG. 3A, it may be attached to the photoelectric conversion unit in the image pick-up tube to thereby provide more precise temperature control. Furthermore, if the layered substrate of FIGS. 2A and 2C is used and the thermometer 34 is attached to the photoelectric conversion unit, still more precise temperature control is achieved. The thermometer 34 may be attached to either the indium ring 15 or the target ring 16 in which case the temperature control of the photoconductive film is provided with a slightly reduced accuracy but without practical problems.

The effects of the present invention are very marked in photoconductive devices which include a photoconductive film, for example, of an amorphous semiconductor including Se mainly, the characteristics of which depend greatly on the temperature of the film.

While application of the present invention to the image pick-up tube has been described above, it should be noted that the present invention is applicable to other photoconductive devices such as photocells, one- and two-dimensional sensors with similar effects, of course.

These and other objects and many of the attendant advantages of the present invention will be readily appreciated as the same becomes better understood by reference to the following detailed description when considered in conjunction with the accompanying drawings.

DESCRIPTION OF THE PREFERRED EMBODIMENTS

Specific embodiments of the present invention will be described hereinafter.

EXAMPLE 1

Figure 1:
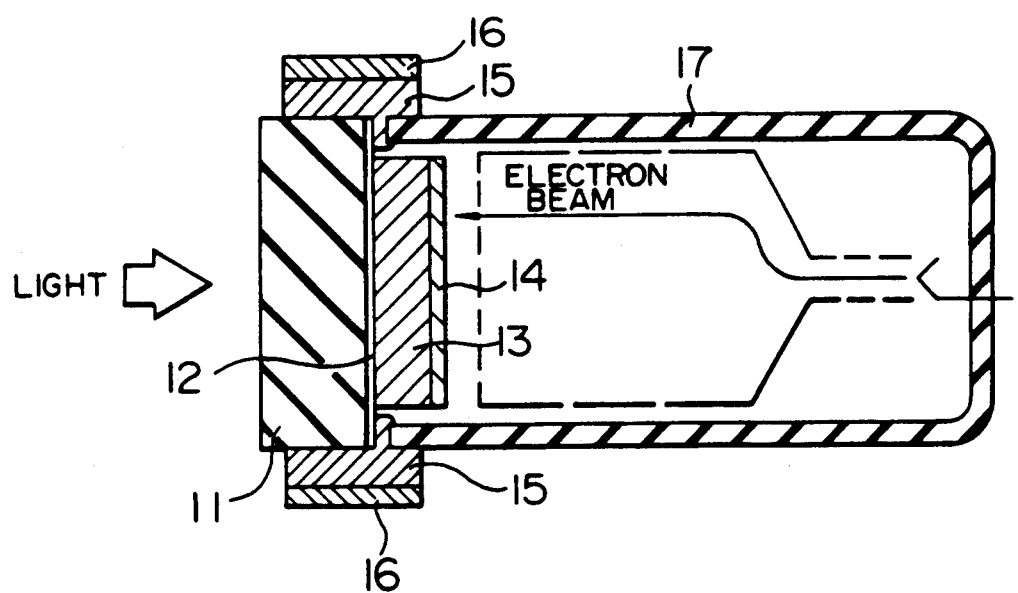
FIG. 1 is a schematic cross-sectional view of an image pick-up tube according to the present invention.
Figure 3A:
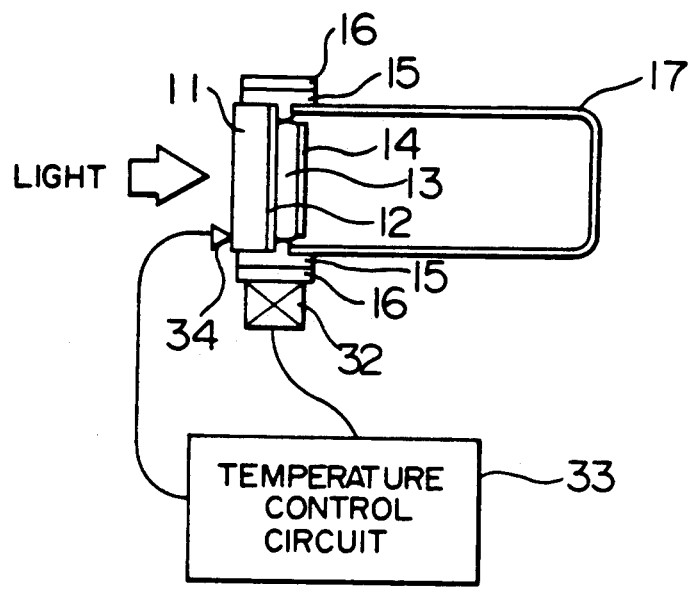
FIG. 3A is a conceptual view of an illustrative photoconductive device having a temperature control system.

Formed sequentially by vacuum vapor deposition on a single crystal sapphire substrate having a diameter of 17.6 mm and a thickness of 1.5 mm are a translucent Al-film (preferably having a thickness of 100-300Å) and a photoconductive film containing 2% by weight of As and having a thickness of 2 $\mu$m. Further, a $Sb_2S_3$ film having a thickness for the 0.1 $\mu$m as a landing layer of electron beam functioning also as a layer for preventing electron injection into the photoconductive film is deposited on the photoconductive film in an atmosphere of Ar at $2.5 \times 10^{-1}$ Torr to thereby provide an image pick-up target, which is then press attached to a housing of the image pick-up tube which includes a built-in electron gun and also built-in deflecting and focusing electrodes through an indium ring. The housing is then evacuated and hermetically sealed to provide the image pick-up tube of FIG. 1. As shown in FIG. 3A and B, a heater and/or cooler 32, for example, of a Peltier device is attached to the outer periphery of a target ring 16 and a thermometer 34, for example, of a thermocouple is attached to the substrate 11. Thus the control of the substrate temperature and hence the photoconductive film formed thereon is possible. The present image pick-up tube can easily maintain the temperature of the substrate 11 substantially constant for a long time by temperature control.

Figure 4:
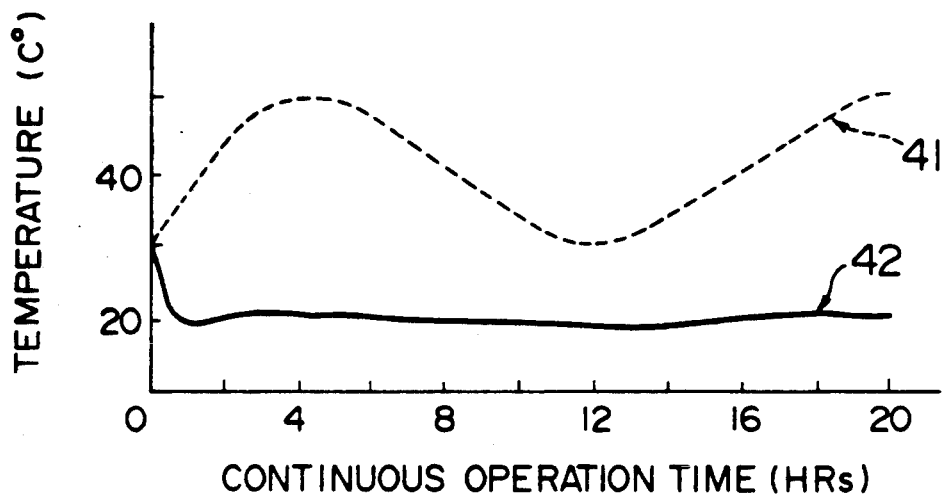
FIG. 4 illustrates the effect of control on fluctuations of the substrate temperature by the temperature control in an illustrative temperature control system according to the present invention.

FIG. 4 shows changes in the temperature of the surface of the substrate which is intended to be maintained at 20° C. In FIG. 4, the solid line 42 shows the substrate temperature of the image pick-up tube subjected to temperature control while the broken line 41 shows fluctuations of the atmosphere temperature during operation. When using conventional techniques with no temperature control, the substrate temperature exhibits large fluctuations when it follows the broken line 41. In contrast, according to the present invention, the substrate temperature can be maintained at a substantially constant temperature of 20° C. for a long time, as will be obvious in FIG. 4.

Figure 3B:
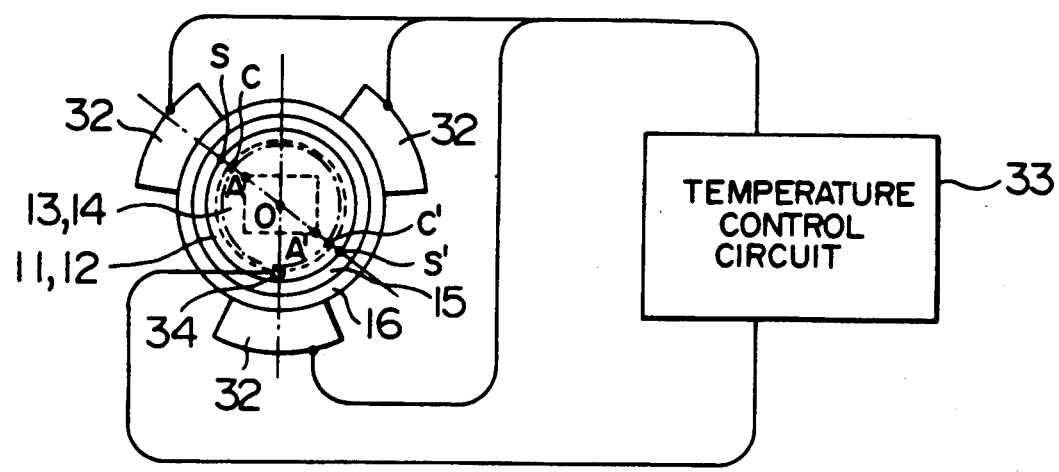
FIG. 3B is a schematic front view of an illustrative photoconductive device having a temperature control system according to the present invention.
Figure 5:
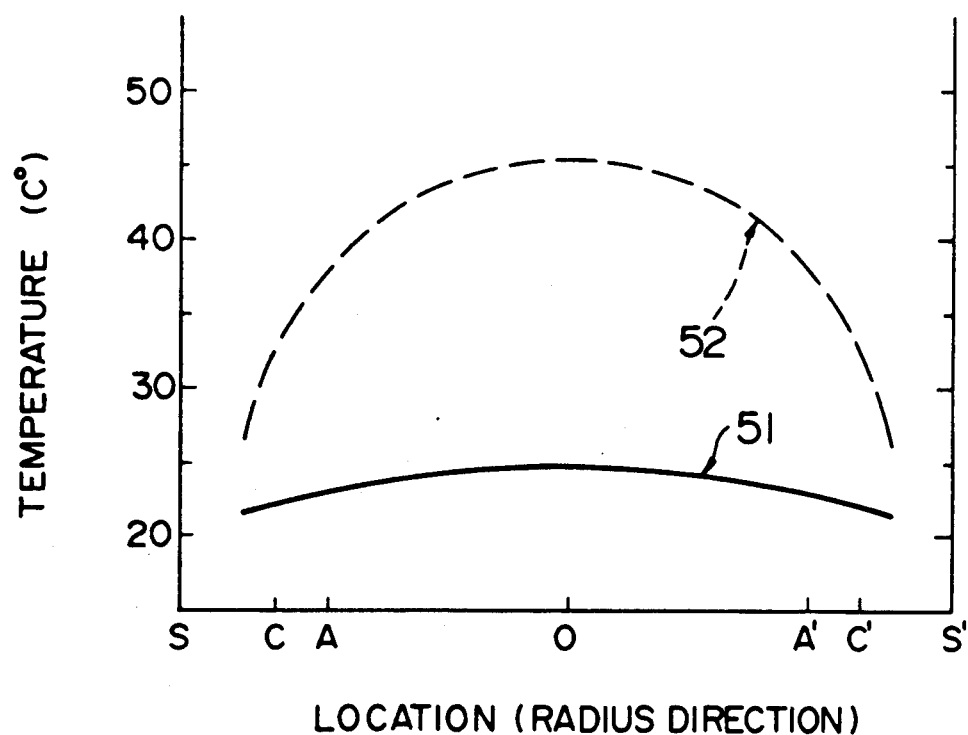
FIG. 5 illustrates a temperature distribution in a radius vector on the substrate surface (on the electron beam scan side) under temperature control in an illustrative image pick-up tube having a temperature control system according to the present invention.

FIG. 5 shows a temperature distribution on the substrate surface (on the electron beam scan side) in the direction of a radius vector, obtained when the target ring of the present image pick-up tube is maintained at 20° C. with the atmosphere temperature being 50° C. In FIG. 5, the axis of abscissas refers to a position on the substrate and points S, S', C, C', A, A' and 0 correspond to points S, S', C, C', A, A' and 0, respectively, shown in FIG. 3B. The position S, S' are on the outer periphery of the substrate; C, C', on the outer periphery of the photoconductive film; A, A' at diagonal points of the electron scan area; and 0 at the center of the substrate.

The solid line 51 in FIG. 5 shows a distribution of temperature in the single crystal sapphire substrate used in the present invention. The broken line 52 shows a distribution of temperature in the conventional glass substrate cooled similarly. As will be obvious in FIG. 5, the effect of cooling the substrate according to the present invention is greatly improved and the uniformity of temperature distribution on the substrate surface is improved.

The image pick-up tube of the present embodiment has the advantages that it can be made with the same manufacturing device and method as those used in the past by using a single crystal sapphire having the same dimensions as the conventional glass substrate, and the advantages that the overall substrate is made of a material of high thermal conductivity and that the temperature control of the photoconductive film is provided easily.

EXAMPLE 2

Figure 2A:
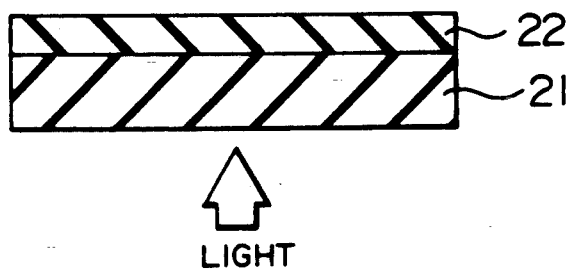
FIGS. 2A-2C are each a cross-secitonal view of a layered substrate according to the present invention.

A glass plate 21 is bonded to a thin single crystal sapphire plate 21 with a colorless transparent adhesive such as epoxy resin such that no bubbles are left in the adhesive to provide a ⅓ inch-sized image pick-up tube layered substrate shown in FIG. 2A. Formed on this substrate in accordance with the processes described in Example 1 are a translucent Al film or a conventional transparent conductive film such as an indium oxide film, an amorphous Se film or an amorphous semiconductor including Se mainly, and a $Sb_2S_3$ film to thereby provide an image pick-up tube target, which is then attached through an indium ring to a housing of the image pick-up tube with a built-in electron gun, etc. The housing is then evacuated and hermetically sealed to thereby obtain a photoconductive image pick-up tube.

The image pick-up tube of the present Example includes glass plate 21 of low thermal conductivity on the surface side (light-incident side) of the layered substrate and the temperature of the photoconductive film is controlled through the sapphire plate under conditions where heat transer from the light-incident side is suppressed. Thus the temperature of the photoconductive film can be controlled more efficiently and more precisely.

EXAMPLE 3

Figure 2B:
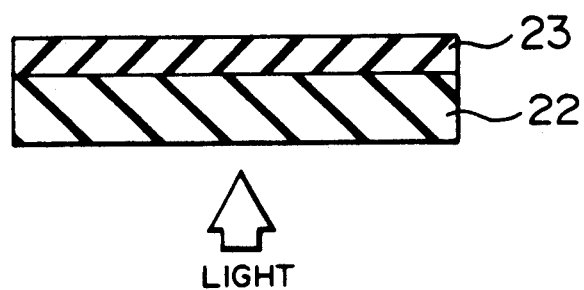

A glass film is formed so as to be 5-10 μm thick by sputtering on a single crystal silicon carbide. The surface of the glass film is then polished and washed to obtain a 1 inch-sized image pick-up layered substrate shown in FIG. 2B. A photoconductive image pick-up tube is obtained with the layered substrate by a process similar to that used for Example 2.

The image pick-up tube of the present Example has the glass film on the side of the layered substrate where the photoconductive film is formed. The glass film surface can be polished much smoother so as to obtain a reduced rate of occurrence of image defects

EXAMPLE 4

Figure 2C:
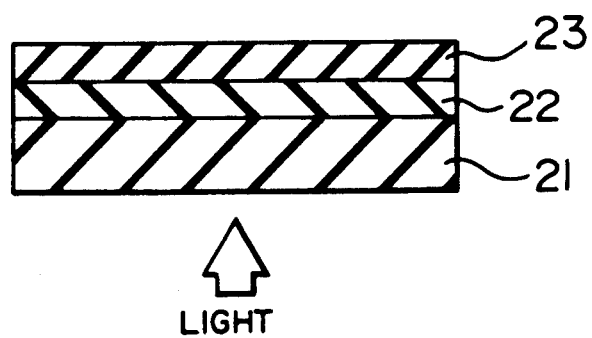

Formed on a glass plate by CVD or vapor deposition is a diamond-like carbon film having a thickness of 10 μm. The carbon film is then bonded to a 0.1 mm-thick glass plate with an adhesive such as a transparent epoxy resin so as not to leave air bubbles in the adhesive to obtain a 1 inch-sized layered substrate of FIG. 2C. The substrate is used to obtain a photoconductive image pick-up tube by a process similar to that used in Example 2. An auxiliary layer for blocking injection of holes, for example, of a 100-300 Å-thick $CeO_2$ layer, may be provided between the transparent conductive film and the Se photoconductive film in Examples 1-4.

The image pick-up tube of the present Example has the same advantages as Examples 2 and 3.

When a camera including the present image pick-up tube picked up an image while controlling the substrate temperature at 20° C., a good image was obtained without lags. The lifetime was long.

EXAMPLE 5

Figure 6A:
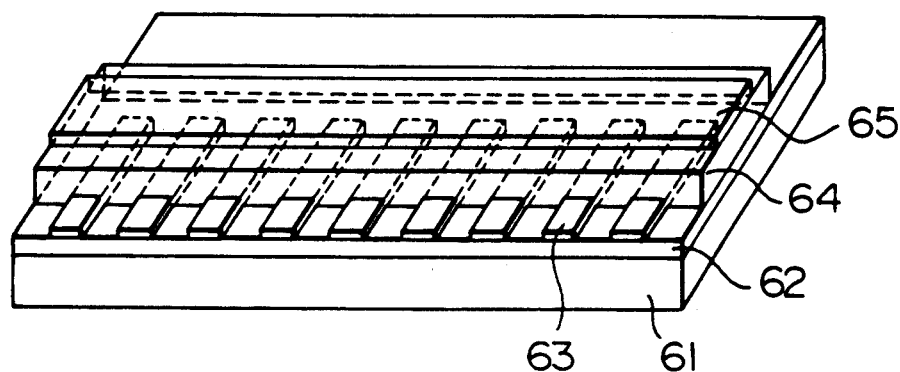
FIG. 6A is a perspective view of an illustrative one-dimensional line sensor according to the present invention.
Figure 6B:
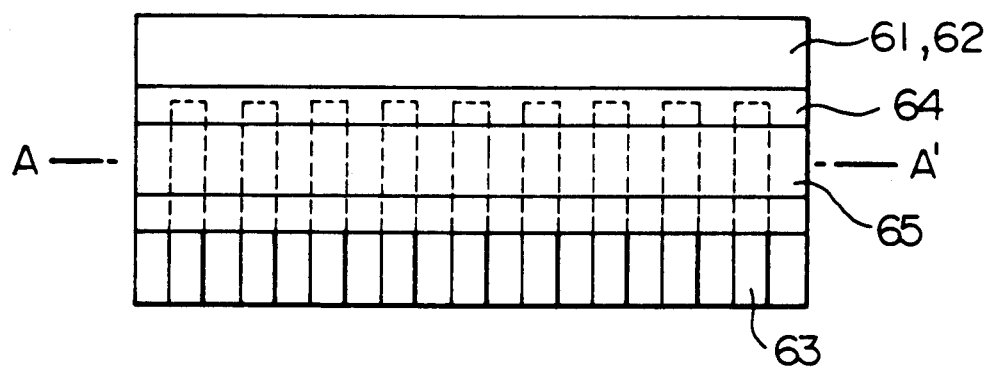
FIG. 6B is a plan view of the one-dimensional line sensor of FIG. 6A.
Figure 6C:
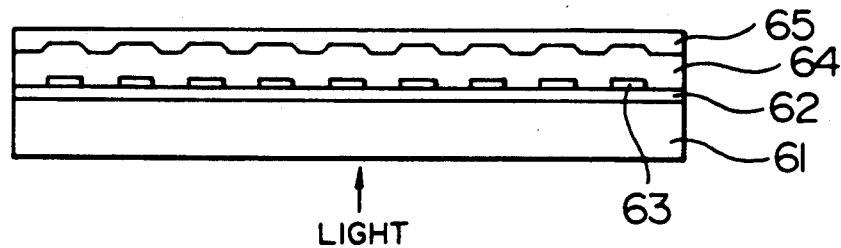
FIG. 6C is a cross-sectional view of the one-dimensional line sensor of FIG. 6A.

In Example 5, a solid state image sensor according to the present invention will be described with respect to FIGS. 6A-6C. A one-dimensional long image sensor will be taken as one example of solid state image sensors. FIG. 6A is a perspective view of the image sensor; FIG. 6B is a plan view of the image sensor; and FIG. 6C is a cross-sectional view taken along the line A—A' of FIG. 6B.

A thin single crystal sapphire plate 62 is bonded to a glass plate 61 to obtain a layered substrate. A transparent conductive film is formed on the sapphire plate by conventional techniques and separated into individual read-out terminals 63 by photoetching. A 0.5-6 μm-thick amorphous photoconductive film 64 mainly including Se is formed on the read-out terminals through a mask with a strip-like hole therein. A conductive film 65 is then deposited on the film 64 to constitute a photoelectric conversion unit. The read-out terminals 63 of the photoelectric conversion unit are then connected as by bonding with a scanning circuit (not shown) provided on the glass plate 61 or the layered substrate to obtain a one-dimensional long image sensor according to the present invention.

The one-dimensional long image sensor has a high thermal conductivity material on a part of the substrate and the advantages of easy temperature control of the photoconductive film and of uniform pixel performance.

Avalanche multiplication of electric carriers will occur in the photoconductive film by applying an electric field of more than $8 \times 10^5$ volts/cm across the amorphous Se photoconductive film of each of the photoconductive devices obtained in Examples 1-5 to thereby provide a high sensitivity characteristic having a gain higher than 1 (unity). If a photoconductive device having a thickness, for example, of 2 μm is impressed with 240 volts, an output with a gain of about 10 is obtained.

Figure 7:
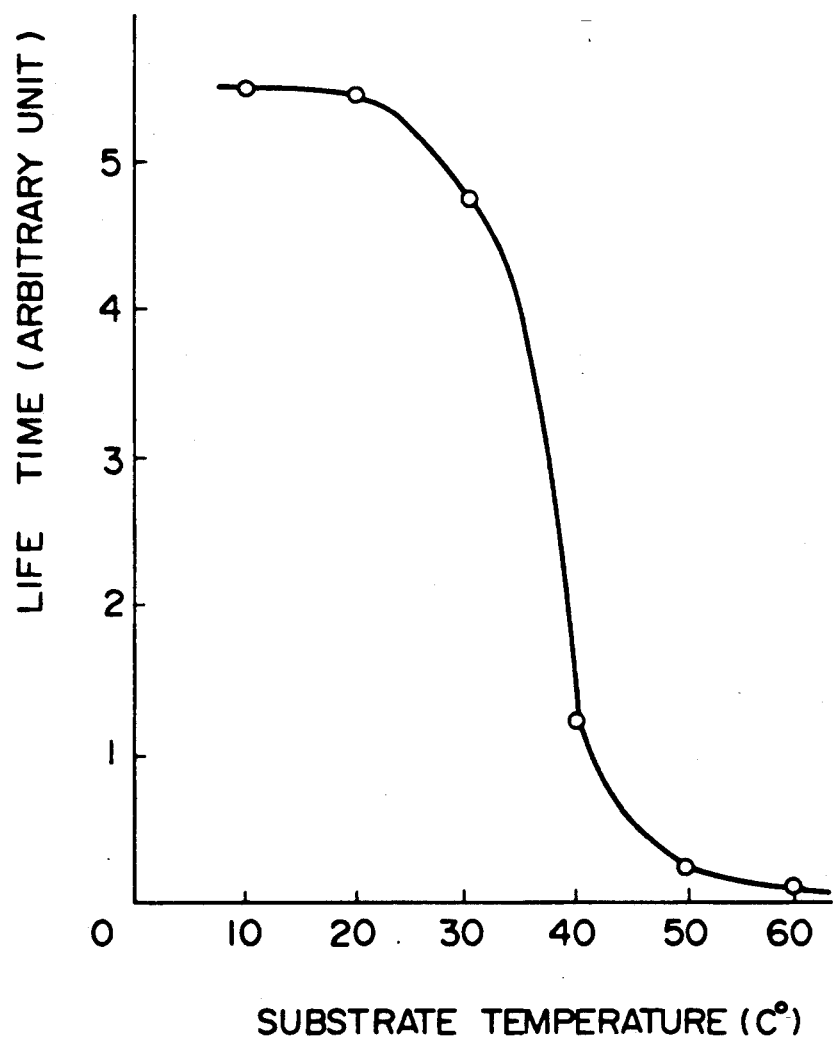
FIG. 7 illustrates the relationship between substrate temperature and service life of an image pick-up tube having an amorphous-Se photoconductive film according to the present invention.

FIG. 7 illustratively shows the relationship between lifetime characteristic and temperature of an image pick-up tube having an amorphous Se photoconductive film when the tube is impressed with a voltage which will cause avalanche multiplication in the photoconductive film. It is obvious in FIG. 7 that if the image pick-up tube having the amorphous Se photoconductive film and to which the present invention is applied is maintained at a temperature of 30° C. or less, its lifetime is greatly prolonged.

According to the present invention, the temperature of the photoconductive device is controlled easily and precisely, so that the excellent characteristics of the photoconductive device are exhibited stably for a long time.

It is further understood by those skilled in the art that the foregoing description is directed to preferred embodiments of the disclosed device and that various changes and modifications may be made in the present invention without departing from the spirit and scope thereof.

What is claimed is:

1. A photoconductive device comprising a transparent substrate having a layer made of an insulator of high thermal conductivity on at least part of the substrate; a transparent conductive film formed on the substrate; and a photoconductive film formed on the transparent conductive film.

2. A photoconductive device according to claim 1, wherein the substrate includes a double layered substrate which, in turn, includes a glass layer made mainly of silicon oxide and a layer of an insulator formed on the glass layer and of high thermal conductivity.

3. A photoconductive device according to claim 2, wherein the transparent conductive film is formed on the glass layer.

4. A photoconductive device according to claim 2, wherein the transparent conductive film is formed on the layer made of an insulator material of high thermal conductivity.

5. A photoconductive device according to claim 1, wherein the transparent substrate includes a triple layered substrate which in turn includes a glass layer made mainly of silicon oxide, a layer of an insulator formed on the glass layer and of high thermal conductivity and a glass layer made mainly of silicon oxide and formed on the layer of an insulator of high thermal conductivity.

6. A photoconductive device according to claim 1, wherein the layer of an insulator includes at least one kind of material selected from the group consisting of single crystal sapphire, single crystal silicon carbide, single crystal silicon nitride, single crystal cubic boron nitride, single crystal diamond, amorphous diamond-like carbon and amorphous silicon carbide.

7. A photoconductive device according to claim 1, further including a terminal connected electrically with the transparent conductive film and an electron gun provided opposite the photoconductive film.

8. A photoconductive device according to claim 1, wherein the transparent conductive film is separated into a plurality of strips.

9. A photoconductive device according to claim 1, wherein the photoconductive film is made of an amorphous material including Se mainly.

10. A photoconductive device according to claim 1, further including means for controlling the temperature of the photoconductive film.

11. A photoconductive device according to claim 10, wherein the photoconductive film is maintained at a temperature of 40° C. or less by the controlling means.

12. A photoconductive device according to claim 8, including means for applying a voltage to cause avalanche multiplication of electric carriers in the photoconductive film.

13. A photoconductive device according to claim 12, wherein a field strength in the photoconductive film when the voltage to cause the avalanche multiplication is applied across the photoconductive film is more than $8 \times 10^5$ volts/cm.

14. A method of operating a photoconductive device comprising a transparent substrate having a layer of an insulator of high thermal conductivity on at least part of the substrate; a transparent conductive film formed on the substrate; and a photoconductive film formed on the transparent conductive film, the method comprising the step of controlling the temperature of the photoconductive device.

15. A method according to claim 14, wherein the temperature of the layer of an insulator is controlled.

16. A method according to claim 14, wherein the temperature of a material of high thermal conductivity and in contact with the layer of an insulator of high thermal conductivity is controlled.

17. A method according to claim 14, wherein the temperature of the photoconductive film is controlled.

* * * * *